United States Patent [19]
Da Costa Alves et al.

[11] Patent Number: 5,435,481
[45] Date of Patent: Jul. 25, 1995

[54] SOLDERING PROCESS

[75] Inventors: Francisco Da Costa Alves; William B. Mullen, III, both of Boca Raton; John M. Nickelsen, Jr., Coral Springs, all of Fla.

[73] Assignee: Motorola, Inc., Schaumburg, Ill.

[21] Appl. No.: 181,724

[22] Filed: Jan. 18, 1994

[51] Int. Cl.⁶ .............................................. B23K 1/20
[52] U.S. Cl. ..................................... 228/223; 228/36
[58] Field of Search ............ 228/223, 203, 36, 179.1, 228/175; 29/840, 843

[56]  References Cited
U.S. PATENT DOCUMENTS

| | | | |
|---|---|---|---|
| 3,034,478 | 5/1962 | Schwartz | 228/36 |
| 4,239,576 | 12/1980 | Taki et al. | 29/840 |
| 4,720,324 | 1/1988 | Hayward | 156/645 |
| 5,177,134 | 1/1993 | Mullen et al. | 524/284 |
| 5,203,075 | 4/1993 | Angulas et al. | 228/180.22 |

OTHER PUBLICATIONS

IBM Technical Disclosure Bulletin, "Automatic Flux Applicator", vol. 34, No. 2, Jul. 1991, pp. 356–357.

Primary Examiner—Mark Rosenbaum
Assistant Examiner—Jeanne M. Elpel
Attorney, Agent, or Firm—Dale W. Dorinski

[57] ABSTRACT

A soldering process for use with solder clad printed circuit boards (10) uses a pin transfer means to apply a tacking agent to the substrate. An array of pins (24) is dipped into a film of tacking agent (22). The pins are removed from the tacking agent (26) carrying with them a predetermined amount of tacking agent. The pins are then contacted (27) to the printed circuit board and removed (28). During this process, a predetermined amount of tacking agent is deposited at selective locations on the printed circuit board. A component is placed (30) on the printed circuit board in the tacking agent and the circuit board and component are heated (40) in order to reflow the solder and effect the solder joint between the component and the board.

10 Claims, 1 Drawing Sheet

SOLDERING PROCESS

TECHNICAL FIELD

This invention relates in general to a process for soldering and in particular to a process for soldering components to printed circuit substrates.

BACKGROUND

The process of soldering electronic circuitry involves placing and soldering leaded and leadless components on a printed circuit board. During the assembly process, components must be maintained in their proper positions prior to and during the soldering operation. In the case of leaded components, leads inserted into holes in the printed circuit board serve to aid in fixturing the component in place during the soldering operation. In leadless component soldering, there exists a need to fixture the components so that they remain in place and do not move about.

This is generally accomplished by the use of an adhesive strategically placed underneath or alongside the component. Prior to assembly, solder is applied to the printed circuit board by stenciling or printing solder paste or by cladding the printed circuit board with solder. The adhesive is normally dispensed or deposited onto the printed circuit board, and the components are then placed in the adhesive. The adhesive is cured either thermally or with ultraviolet light. In each of these cases, a solder flux of some sort must be provided in order to facilitate sound metallurgical solder joints. A flux is normally formulated into the solder paste, applied as a coating over the entire circuit board, or applied separately when solder clad circuit boards are used.

The prior art has attempted to utilize conventional soldering fluxes to hold components in place during the soldering operation. U.S. Pat. No. 4,720,324 discloses the use of solder flux coated over the entire surface of the printed circuit board and, while in a tacky state, the components are added. The tackiness or stickiness of the flux is purported to hold the component in place. While it is clear that conventional soldering flux does provide some degree of tackiness, this method does not function adequately. The resulting coating is too thin to act as a sufficient tacking agent and, when small, closely spaced components are soldered, the components tend to be drawn to one another by the surface tension of the flux and do not stay in their selected positions. Flood coating of the printed circuit board cannot be used with small, light components as they tend to swim or move about in the flux.

Clearly, there exists a need for a process to provide a high efficiency, temporary fixturing means for components and also to provide a fluxing action for the soldering operation. Such a process would ideally be compatible with printed circuit substrates using clad solder surfaces and would be highly efficient.

SUMMARY OF THE INVENTION

Briefly, according to the invention, a soldering process is disclosed for use with a circuit carrying substrate having a plurality of solderable portions. A predetermined amount of tacking agent is substantially simultaneously deposited on each of the solderable portions of the circuit carrying substrate. A component having one or more solderable surfaces is then placed in the tacking agent and the substrate and component are heated in order to solder the component to the circuit carrying substrate.

In a further embodiment of the invention, the process for depositing the tacking agent on the substrate consists of the steps of dipping a plurality of pins into a film of tacking agent in order to deposit some tacking agent on each pin. The pins are then removed from the tacking agent and contacted to the circuit carrying substrate in order to transfer the deposited tacking agent from the pins to the substrate. The pins are then removed from the circuit carrying substrate, leaving the predetermined amount of tacking agent on the circuit carrying substrate.

In still another embodiment of the invention, the substrate is a printed circuit board having pads clad with solder and the process of depositing the tacking agent is performed with a pin transfer means.

BRIEF DESCRIPTION OF THE DRAWINGS

FIG. I is a flow chart showing the soldering process in accordance with the present invention.

DETAILED DESCRIPTION OF THE PREFERRED EMBODIMENT

The process for soldering surface-mounted components using solid-solder deposition is a rapidly evolving technology. Many techniques for the application of the solder have been developed. One process, known as "solder cladding," utilizes circuit-carrying substrates or printed circuit boards that have a predetermined layer of solder applied to the solder pads. The layer of solder is of sufficient thickness so as to provide all the needed solder during the reflow process. Typically, printed circuit boards are coated with a thickness of solder between 0.02 and 0.2 mm. by the circuit board manufacturer. The use of solder cladding precludes the need to print solder paste or otherwise deposit solder on the circuit board during the assembly process since, obviously, the solder is on the pads prior to assembly. Since solder paste is not used, some other means of providing a soldering flux to the solder must be incorporated. Many approaches to the application of flux have been seen in the prior art, such as point-to-point dispensing, screen printing, spraying, micro-jetting, and so forth. These approaches contain flaws, such as; inflexibility to the product variation, long application cycle times, large variations in the deposited volume of solder flux, missing or absent flux deposits, and high equipment maintenance, all of which result in poor performance at the assembly level.

One technique for soldering electronic components to clad circuit boards utilizes a tacking agent deposited onto the circuit board substrate. The tacking agent provides multiple functions of a fluxing agent and a temporary adhesive. Some suitable tacking agents are disclosed in U.S. Pat. No. 5,177,134, assigned to Motorola, Inc., which is incorporated herein by reference.

Figure 1:
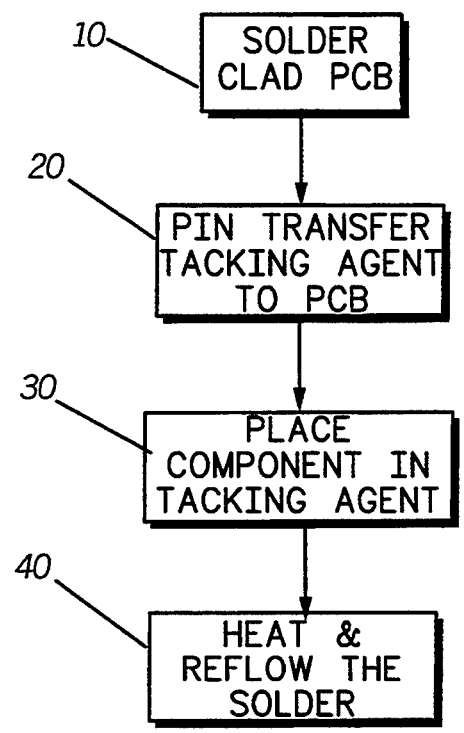

Referring now to FIG. 1, a circuit carrying substrate, such as a printed circuit board or printed wiring board, typically has a plurality of solderable portions or solder pads. One of the first steps in the assembly process is to provide the solder clad printed circuit board as noted in step 10. Step 20 comprises depositing a predetermined amount of tacking agent onto the solder pads or solderable portions of the circuit board. Step 20 is accomplished in the preferred embodiment by a mechanism of pin transfer.

Figure 2:
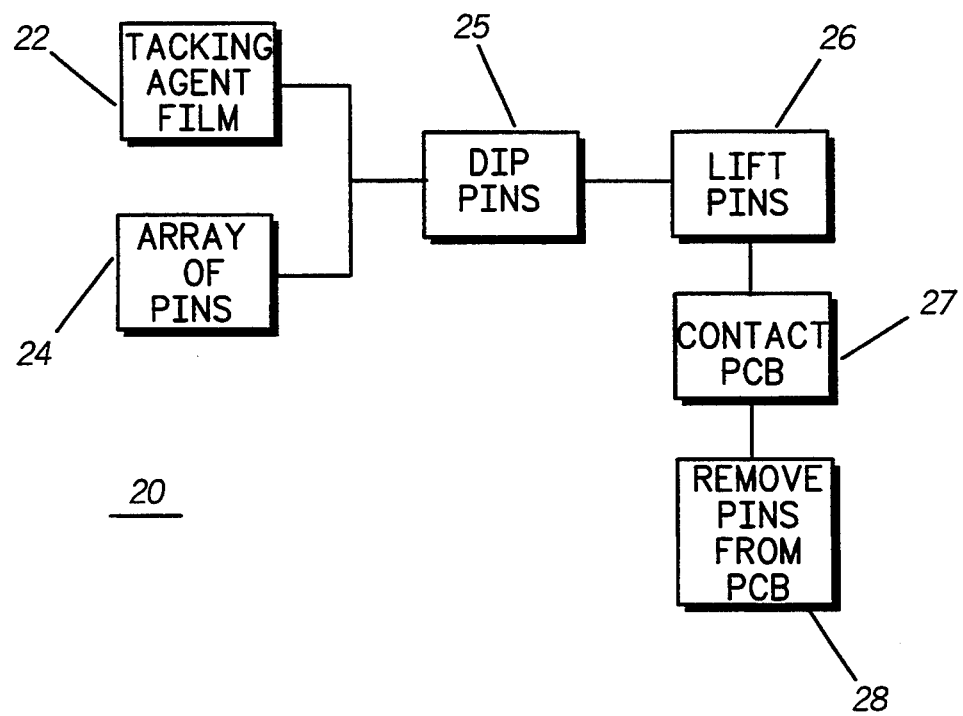
FIG. 2 is a flow chart showing details of the pin transfer process in accordance with the present invention.

Referring briefly to FIG. 2, the details of the pin transfer process are outlined in further detail. A thin film or a reservoir of the tacking agent is provided (22). One of the preferred methods of providing the film of tacking agent is to doctor blade a film over a smooth substrate. Techniques for doctor bladeing films are well known in the art. An array of pins (24) corresponding to the locations on the printed circuit board that will receive the tacking agent is dipped into the film of tacking agent as noted in step 25. During this step, a precise amount of the tacking agent is transferred from the doctor bladed film onto each pin. This transfer of tacking agent onto the pins is accomplished substantially simultaneously if the entire array of pins 24 is placed into the film 22 at one time. In step 26, the pins are removed from the tacking agent, each pin carrying with it a predetermined amount of tacking agent. Step 27 contacts the printed circuit board with the array or plurality of pins, thereby transferring the deposited tacking agent from the pins to the solderable pads on the circuit board. Step 28 is the removal or lifting of the plurality of pins off of the printed circuit board, thereby leaving a very precise amount of tacking agent at each selected location on the printed circuit board.

Referring back to FIG. 1, in step 30, a component is placed on the printed circuit board. The component typically has at least one solderable surface and, in the preferred embodiment, components such as chip carriers having a plurality of solderable-surfaces are used. Chip carriers typically have an array of solder pads as in, for example, pad array chip carriers, or a large plurality of leads, as in quad flat packs. Obviously, one skilled in the art will recognize that other types of components such as capacitors, resistors, and so on, could be used, or a component could be something as simple as a solder ball or other type of solder preform. In this case, the pin transfer mechanism and soldering process of the present invention could be used to, for example, bump a pad array chip carrier with a plurality of solder balls.

The component is placed on the printed circuit board using any number of conventional placement means and is placed such that the solderable portion or solderable surface on the component is placed in the tacking agent, so that the tacking agent may provide a fluxing action to the solderable surface. The tacking agent also provides a fixturing capability to hold the component in place on the printed circuit board during reflow. The next step is to heat the assembly to melt and reflow the solder and effect a solder joint between the component and the pads on the substrate. In the case where the substrate is clad with solder, the solder melts and wets to the component forming the solder joint. In the case where the component is a solder sphere, the component itself then would melt (reflow) and wet to the substrate. In either case, the substrate and/or the component and/or the solder must be heated to a temperature sufficient to cause the solder to melt and alloy to both parts.

This invention provides a process for soldering components to a printed circuit board that eliminates the need for solder paste at the assembly level, and also increases the capability and precision of the soldering process. Messy and poorly reproducible techniques such as syringe dispensing, screen printing, and so forth, are eliminated and highly precise amounts of tacking agent and flux are provided at a multiplicity of sites in a highly efficient manner. The use of a pin transfer mechanism in the soldering process results in an extremely efficient assembly method.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims. For example, one could use the pin transfer method to simply deposit one portion of tacking agent at a time, or one could use the pin transfer method to deposit all the tacking agent sites on the printed board in a single step, or any fraction in between. In addition, the instant invention also provides a highly efficient method for bumping chip carriers.

What is claimed is:

1. A soldering process, comprising:
   providing a component having at least one solderable surface, providing a circuit carrying substrate having a plurality of solderable portions that are clad with solder in an amount sufficient to effect a solder joint between the component solderable surface and the solderable portion of the substrate when sufficiently heated, providing a thin film of tacking agent, and providing a plurality of pins;
   dipping the plurality of pins into the thin film of tacking agent so as to deposit a portion of the tacking agent on each pin;
   removing the plurality of pins from the thin film of tacking agent;
   contacting the plurality of pins to the circuit carrying substrate solderable portions so as to transfer the deposited tacking agent from each pin to each respective solderable portion; and
   removing the plurality of pins from the circuit carrying substrate solderable portions;
   substantially simultaneously depositing a predetermined amount of tacking agent on each of the circuit carrying substrate solderable portions;
   placing the solderable surface of the component on the tacking agent; and
   heating the circuit carrying substrate and the component in order to solder the component to the circuit carrying substrate.

2. The soldering process as described in claim 1, wherein the solderable surface of the component is clad with solder.

3. The soldering process as described in claim 1, wherein the component is a chip carrier.

4. The soldering process as described in claim 1, wherein the solderable portions of the circuit carrying substrate are clad with a layer of solder between 0.02 mm and 0.2 mm thick.

5. The soldering process as described in claim 1, wherein the step of heating comprises reflowing the solder.

6. The soldering process as described in claim 1, wherein the partial step of providing a thin film of tacking agent comprises a step of creating a thin film of the tacking agent on a smooth substrate using a doctor blade.

7. The soldering process as described in claim 1, wherein the tacking agent is a high viscosity material.

8. The soldering process as described in claim 7, wherein the viscosity of the tacking agent is between 20 and 1500 centipoise.

9. A soldering process, comprising:

providing a component having at least one solderable surface that is clad with solder, providing a circuit carrying substrate having a plurality of solderable portions that are clad with a layer of solder between 0.02 mm and 0.2 mm thick, providing a thin film of a high viscosity tacking agent on a substrate using a doctor blade, and providing a plurality of pins;

dipping the plurality of pins into the thin film of tacking agent so as to deposit a portion of the tacking agent on each pin;

removing the plurality of pins from the thin film of tacking agent;

contacting the plurality of pins to the circuit carrying substrate solderable portions so as to transfer the deposited tacking agent from each pin to each respective solderable portion; and removing the plurality of pins from the circuit carrying substrate solderable portions;

substantially simultaneously depositing a predetermined amount of tacking agent on each of the circuit carrying substrate solderable portions;

placing the solderable surface of the component on the tacking agent; and reflowing the solder in order to solder the component to the circuit carrying substrate.

10. The soldering process as described in claim 9, wherein the step of dipping comprises immersing the pins into the thin film until the pins contact the substrate.

* * * * *